United States Patent
Hwang et al.

(10) Patent No.: US 9,515,092 B2
(45) Date of Patent: Dec. 6, 2016

(54) DISPLAY DEVICE AND METHOD OF MANUFACTURING THE SAME

(71) Applicant: Samsung Display Co., Ltd., Yongin, Gyeonggi-Do (KR)

(72) Inventors: Hyun-Been Hwang, Suwon-si (KR); Jung Joon Seo, Yongin-si (KR); In Huh, Seongnam-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/815,772

(22) Filed: Jul. 31, 2015

(65) Prior Publication Data

US 2016/0225792 A1 Aug. 4, 2016

(30) Foreign Application Priority Data

Jan. 29, 2015 (KR) .................. 10-2015-0014270

(51) Int. Cl.
*H01L 21/66* (2006.01)
*H01L 27/12* (2006.01)

(52) U.S. Cl.
CPC .......... *H01L 27/1218* (2013.01); *H01L 22/14* (2013.01); *H01L 22/34* (2013.01); *H01L 27/124* (2013.01); *H01L 27/1259* (2013.01)

(58) Field of Classification Search
CPC ...... H01L 22/22; H01L 22/34; H01L 27/1218; H01L 27/124
See application file for complete search history.

(56) References Cited

U.S. PATENT DOCUMENTS

| 5,317,438 A | * | 5/1994 | Suzuki | G02F 1/13452 349/149 |
| 7,527,541 B2 | | 5/2009 | Couillard | |
| 7,636,145 B2 | * | 12/2009 | Jung | G02F 1/13458 349/149 |

FOREIGN PATENT DOCUMENTS

| KR | 10-2012-0119368 A | 10/2012 |
| KR | 10-2013-0116586 A | 10/2013 |
| KR | 10-2013-0124876 A | 11/2013 |

* cited by examiner

*Primary Examiner* — Daniel Shook
(74) *Attorney, Agent, or Firm* — Knobbe Martens Olson & Bear LLP (57) ABSTRACT

A display device and a method of manufacturing the same are disclosed. In one aspect, the display device includes a display area formed over a substrate and configured to display an image, and a pad area formed over the substrate surrounding the display area and configured to provide an electrical signal to the display area. The pad area includes a first electrode layer formed over the substrate and electrically connected to the display area and a second electrode layer formed over the first electrode layer and electrically connected to the first electrode layer. The pad area also includes a first organic layer bonded to a portion of the second electrode layer at a first adhesion strength, a third electrode layer bonded to the first organic layer at a second adhesion strength and electrically connected to the second electrode layer, and a flexible PCB electrically connected to the third electrode layer.

20 Claims, 5 Drawing Sheets

DISPLAY DEVICE AND METHOD OF MANUFACTURING THE SAME

INCORPORATION BY REFERENCE TO ANY PRIORITY APPLICATIONS

This application claims priority to and the benefit of Korean Patent Application No. 10-2015-0014270 filed in the Korean Intellectual Property Office on Jan. 29, 2015, the entire contents of which are incorporated herein by reference.

BACKGROUND

Field

The described technology generally relates to a display device and a method of manufacturing the same.

Description of the Related Technology

Examples of common display device technologies include liquid crystal displays (LCDs), plasma display panels (PDPs), organic light-emitting diode (OLED) displays, field effect displays (FEDs), electrophoretic displays, and the like.

Such display devices include a display area for generating an image, and a pad area for receiving electric signals from an external power source so as to display the image and for transferring an input signal input from the display area to a controlling unit.

The display area includes gate lines and data lines intersecting each other, thin film transistors (TFTs) connected to the lines, and image implementing layers connected to the TFTs. In addition, the pad area includes a structure in which gate electrodes and data electrodes extended from the gate lines and the data lines are stacked, and can be connected to a flexible printed circuit board (PCB) in order to transmit and receive an electric signal from the external power source and a driving circuit.

During the manufacturing and testing of the display device, after connecting the flexible printed circuit board, products having defects are occasionally found. In order to resolve these defects, the connected flexible PCB will often be removed and reconnected. This process is referred to as a "rework process."

SUMMARY OF CERTAIN INVENTIVE ASPECTS

One inventive aspect is a display device and a method of manufacturing the same having advantages of preventing damage of a product at the time of a rework process.

Another aspect is a display device including: a display area formed on one area of a substrate and displaying an image; and a pad area formed on another area of the substrate and transferring an electrical signal to the display area, wherein the pad area includes: a first electrode layer formed on the substrate and electrically connected to the display area; a second electrode layer formed on the first electrode layer and electrically connected to the first electrode layer; a first organic layer formed on a portion of the second electrode layer; a third electrode layer formed on the first organic layer and electrically connected to the second electrode layer; and a first flexible printed circuit board electrically connected to the third electrode layer, and adhesion between the first organic layer and the second electrode layer is weaker than adhesion between the first organic layer and the third electrode layer.

The first organic layer can have an adhesive layer formed on one surface thereof, and adhesion between the second electrode layer and the first organic layer can be weaker than adhesion between the first organic layer and the adhesive layer and can be weaker than adhesion between the adhesive layer and the third electrode layer.

The adhesive layer can be an amorphous silicon layer.

The display device can further include a second organic layer partially formed between the first electrode layer and the second electrode layer.

The display device can further include a fourth electrode layer formed on the second organic layer and electrically connected to the first electrode layer and the second electrode layer; and a third organic layer formed on the fourth electrode layer, wherein the second electrode layer can be formed on the third organic layer.

The first organic layer can be made of an electrical insulating material.

The substrate can be a rigid substrate or a flexible substrate.

The display device can further include a buffer layer formed on the substrate in order to protect the substrate.

The display area can include a pixel implementing the image, the pixel can include a thin film transistor including a gate electrode, a source electrode, and a drain electrode, and a pixel electrode connected to the drain electrode, the first electrode layer can be formed on the same layer as the gate electrode, the second electrode layer can be formed on the same layer as the source electrode and the drain electrode, and the third electrode layer can be formed on the same layer as the pixel electrode.

Another aspect is a method of manufacturing a display device including forming a display area displaying an image on one area of a substrate; and forming a pad area transferring an electrical signal to the display area on another area of the substrate, wherein the forming of the pad area includes: forming a first electrode layer electrically connected to the display area on the substrate; forming a second electrode layer electrically connected to the first electrode layer on the first electrode layer; forming a third electrode layer electrically connected to the second electrode layer; partially forming a first organic layer having adhesion with the third electrode layer stronger than adhesion with the second electrode layer between the second electrode layer and the third electrode layer; electrically connecting a first flexible printed circuit board to the third electrode layer; checking whether or not defects occur in the display device; removing the first flexible printed circuit board by separating the first organic layer from the second electrode layer at the time of the occurrence of defects in the display device; and connecting a second flexible printed circuit board on the second electrode layer.

The forming of the first organic layer can include: forming an adhesive layer on one surface of the first organic layer; and bonding the other surface of the first organic layer to the second electrode layer.

The manufacturing method can further include forming a second organic layer partially formed between the first electrode layer and the second electrode layer.

The manufacturing method can further include forming a fourth electrode layer electrically connected to the first electrode layer and the second electrode layer on the second organic layer; and forming a third organic layer on the fourth electrode layer, wherein the second electrode layer can be formed on the third organic layer.

Another aspect is a display device comprising: a display area formed over a substrate and configured to display an image; and a pad area formed over the substrate surrounding the display area and configured to provide an electrical signal to the display area. The pad area includes: a first electrode layer formed over the substrate and electrically connected to the display area; a second electrode layer formed over the first electrode layer and electrically connected to the first electrode layer; a first organic layer bonded to a portion of the second electrode layer at a first adhesion strength; a third electrode layer bonded to the first organic layer at a second adhesion strength and electrically connected to the second electrode layer; and a flexible printed circuit board (PCB) electrically connected to the third electrode layer, wherein the first adhesion strength is less than the second adhesion strength.

The above display device further comprises an adhesive layer bonded to the first organic layer at a third adhesions strength and bonded to the third electrode layer at a fourth adhesion strength, wherein the first adhesion strength is less than the third adhesion strength and the fourth adhesion strength.

In the above display device, the adhesive layer is an amorphous silicon layer.

The above display device further comprises a second organic layer formed between the first and second electrode layers.

The above display device further comprises: a fourth electrode layer formed over the second organic layer and electrically connected to the first and second electrode layers; and a third organic layer formed over the fourth electrode layer, wherein the second electrode layer is formed over the third organic layer.

In the above display device, the second to fourth electrode layers have the same width.

In the above display device, the first organic layer is formed of an electrical insulating material.

In the above display device, the substrate is flexible.

The above display device further comprises a buffer layer formed over the substrate so as to protect the substrate.

In the above display device, the display area includes a pixel configured to display the image, wherein the pixel includes i) a thin film transistor including a gate electrode, a source electrode, and a drain electrode, and ii) a pixel electrode electrically connected to the drain electrode, wherein the first electrode layer is formed on the same layer as the gate electrode, the second electrode layer is formed on the same layer as the source and drain electrodes, and wherein the third electrode layer is formed on the same layer as the pixel electrode.

In the above display device, the second and third electrodes have the same width.

Another aspect is a method of manufacturing a display device, the method comprising: forming a display area over a substrate and configured to display an image; and forming a pad area surrounding the display area and configured to provide an electrical signal to the display area. The forming of the pad area includes: forming a first electrode layer electrically connected to the display area; forming a second electrode layer over the first electrode layer and electrically connected to the first electrode layer; forming a third electrode layer electrically connected to the second electrode layer; adhering a first organic layer to the second electrode layer at a first adhesion strength and the third electrode layer at a second adhesion strength, wherein the first adhesion strength is greater than the second adhesion strength; electrically connecting a first flexible printed circuit board (PCB) to the third electrode layer; testing for defects in the display device; separating the first organic layer from the second electrode layer so as to remove the first flexible PCB when there are defects in the display device; and connecting a second flexible PCB to the second electrode layer.

In the above method, the forming of the first organic layer includes: forming an adhesive layer on a first surface of the first organic layer; and bonding a second surface of the first organic layer to the second electrode layer.

The above method further comprises forming a second organic layer between the first and second electrode layers.

The above method further comprises: forming a fourth electrode layer over the second organic layer and electrically connected to the first and second electrode layers; and forming a third organic layer over the fourth electrode layer, wherein the second electrode layer is formed over the third organic layer.

Another aspect is a display device comprising: a display area formed over a substrate and configured to display an image; and a pad area surrounding the display area and configured to provide an electrical signal to the display area. The pad area includes: a first electrode layer formed over the substrate; a second electrode layer formed over and directly contacting the first electrode layer; a first organic layer bonded to a portion of the second electrode layer at a first adhesion strength; a second organic layer formed between the portion of the second electrode layer and a portion of the first electrode layer; a third electrode layer bonded to the first organic layer at a second adhesion strength, wherein the third electrode layer directly contacts the second electrode layer; and a flexible printed circuit board (PCB) formed over the first to third electrode layers, wherein the first adhesion strength is less than the second adhesion strength.

The above display device further comprises an adhesive layer bonded to the first organic layer at a third adhesions strength and bonded to the third electrode layer at a fourth adhesion strength, wherein the first adhesion strength is less than the third adhesion strength and the fourth adhesion strength.

The above display device further comprises: a fourth electrode layer formed over the second organic layer and electrically connected to the first and second electrode layers; and a third organic layer formed over the fourth electrode layer, wherein the second electrode layer is formed over the third organic layer.

In the display device, the substrate is flexible.

In the display device, the display area includes a pixel configured to display the image, wherein the pixel includes i) a thin film transistor including a gate electrode, a source electrode, and a drain electrode, and ii) a pixel electrode electrically connected to the drain electrode, wherein the first electrode layer is formed on the same layer as the gate electrode, wherein the second electrode layer is formed on the same layer as the source and drain electrodes, and wherein the third electrode layer is formed on the same layer as the pixel electrode.

According to at least one of the disclosed embodiments, since a damage rate of the product due to the rework process can be reduced, yield of the product can be increased and the display device and the manufacturing method of the same capable of reducing manufacturing costs can be provided.

DETAILED DESCRIPTION OF CERTAIN INVENTIVE EMBODIMENTS

During the testing phase, in the process of removing a flexible PCB panel, the stack structure of the pad area or the board can be damaged.

Hereinafter, exemplary embodiments will be described in detail with reference to the accompanying drawings. However, in describing the described technology, a description of a well-known function or configuration will be omitted in order to make the gist of the described technology obvious. In this disclosure, the term "substantially" includes the meanings of completely, almost completely or to any significant degree under some applications and in accordance with those skilled in the art. Moreover, "formed on" can also mean "formed over." The term "connected" can include an electrical connection.

Hereinafter, a display device according to an exemplary embodiment will be described with reference to the accompanying drawings.

Figure 1:
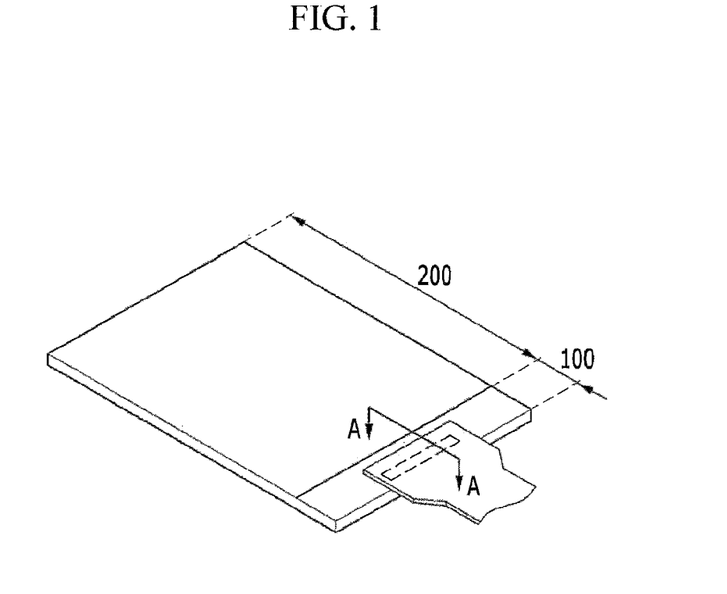
FIG. 1 is a drawing illustrating a display device to which a flexible printed circuit board is connected, according to an exemplary embodiment.

As illustrated in FIG. 1, a display device according to the present exemplary embodiment is partitioned into a display area 200 formed on one area of a substrate 110 and a pad area 100 formed on another area of the substrate 110.

The substrate 110 can be a rigid substrate formed of a material such as glass and plastic, or a flexible substrate formed of a material such as polyimide. As long as the material is not a substrate material which makes an implementation of the described technology impossible with reference to the description of the described technology to be described below, any material can be included in the scope of the described technology regardless of a kind and nature of material.

Here, the substrate 110 can further include a buffer layer 120 formed on an overall area covering the display area 200 and the pad area 100 in order to protect a surface of the substrate 110.

The buffer layer 120 can be formed of an electrical insulating material, similar to the substrate 110, but is not limited thereto.

The display area 200 is an area implementing an image and the display area 200 can be formed on one area of the substrate 110 as illustrated in FIG. 1.

The display area 200 can include known components such as an electrode necessary to implement the image, a display layer including a plurality of pixels, and a TFT.

Since specific configurations of the display area 200 can be changed depending on a kind of each device such as a liquid crystal display (LCD), a plasma display panel (PDP), an organic light-emitting diode (OLED) display, a field effect display (FED), or an electrophoretic display device, the specific configurations are not illustrated.

Although not illustrated in the accompanying drawings, the display device according to the present exemplary embodiment includes a plurality of signal lines and pixels connected to the signal lines, by way of example. The pixel PX can be any one of a red pixel R, a green pixel G, and a blue pixel B.

The signal lines include gate lines transferring a scan signal, data lines transferring a data signal, driving voltage lines transferring a driving voltage, and the like.

The gate lines are extended in a row direction and are substantially parallel to each other, and the data lines are extended in a column direction and are substantially parallel to each other. The driving voltage lines can be extended in the column direction, but can be extended in the row direction or the column direction or can be formed in a mesh shape.

In this case, the respective pixels PX formed in the display area 200 include TFTs including gate electrodes, source electrodes, and drain electrodes, and pixel electrodes connected to the drain electrodes.

Meanwhile, the pad area 100 is formed on another area of the substrate 110 on which the display area 200 is formed, and is supplied with an electrical signal that can generate the image on the display area 200 from the outside so as to transfer the electrical signal. In addition, the pad area 100 can transfer an input signal input from the display area 200 by a user to an external control apparatus controlling the driving of the display device.

Figure 2:
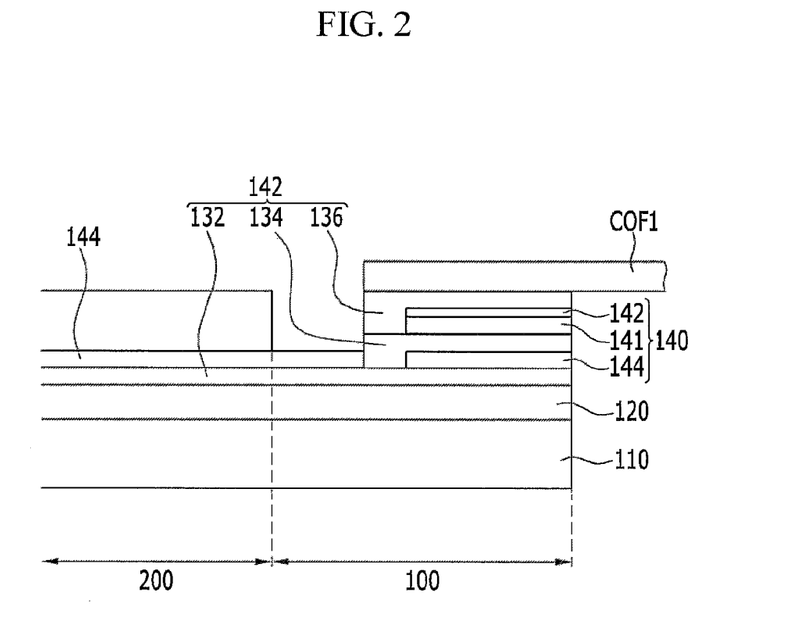
FIG. 2 is a drawing illustrating cross sections of a pad area and a display area of the display device illustrated in FIG. 1.

In order to perform the above-mentioned functions, the pad area 100 can include a first electrode layer 132, a second electrode layer 134, a first organic layer 141, a third electrode layer 136, and a first flexible PCB COF1.

The first electrode layer 132 is formed on the substrate 110 corresponding to the pad area 100 and is electrically connected to the display area 200. The second electrode layer 134 is formed on the first electrode layer 132 and is electrically connected to the first electrode layer 132. The third electrode layer 136 is electrically connected to the second electrode layer 134.

The display device according to the present exemplary embodiment includes the first organic layer 141 between the second electrode layer 134 and the third electrode layer 136. The first organic layer 141 can be formed on a portion of the second electrode layer 134 so that the second electrode layer 134 and the third electrode layer 136 can be electrically connected to each other and can allow the second electrode layer 134 and the third electrode layer 136 to be electrically connected to each other through the remaining portion.

In this case, by way of example, the first electrode layer 132 can be electrically connected to the gate electrode of the TFT connected to the gate lines and can be formed on the same layer as the gate electrode.

The second electrode layer 134 according to the present exemplary embodiment can be electrically connected to the source electrode and the drain electrode (hereinafter, referred to as a source/drain electrode) of the TFT connected to the data lines and the driving voltage lines and can be formed on the same layer as the source/drain electrode.

The third electrode layer 136 can be electrically connected to the pixel electrodes formed in the respective pixels and can be formed on the same layer as the pixel electrode. In this case, the pixel electrode can be formed of a transparent electrode material such as ITO and IZO so as to emit generated light to the outside, and consequently, the third electrode layer 136 can also be formed of the transparent electrode material such as ITO and IZO.

However, the example described above describes an example of the display device, and configurations in which the first electrode layer 132, the second electrode layer 134, and the third electrode layer 136 are each electrically connected to each other can be different.

In this case, the pad area 100 of the display device includes the first organic layer 141 which is partially formed between the second electrode layer 134 and the third electrode layer 136, as described above.

One surface of the first organic layer 141 is bonded to one surface of the second electrode layer 134 and the other surface of the first organic layer 141 is bonded to one surface of the third electrode layer 136. In this case, the adhesion (or adhesiveness) between the one surface of the first organic layer 141 and the one surface of the second electrode layer 134 is weaker than the adhesion between the other surface of the first organic layer 141 and the one surface of the third electrode layer 136. Therefore, in the case in which separation occurs between the organic layers and the electrode layers due to external force applied thereto, the first electrode layer 132 and the third electrode layer 136 can maintain the bonding therebetween and the first organic layer 141 and the second electrode layer 134 can be separated.

Therefore, in the case in which the first organic layer 141 is separated from the display device by applying the external force in order to perform a rework process due to defects occurring in a product during a process of manufacturing the display device according to the present exemplary embodiment, since the second electrode layer 134 and the first organic layer 141 are separated, the third electrode layer 136 and the first organic layer 141 can be integrally removed from the display device.

In the case in which the first organic layer 141 and the second electrode layer 134 are easily separated, since the applied external force can be applied to only separate the first organic layer 141 and the second electrode layer 134, it is possible to prevent damage of the display device due to the external force applied at the time of the separation layers below the second electrode layer 134 such as the substrate 110 and the first electrode layer 132.

Figure 3:
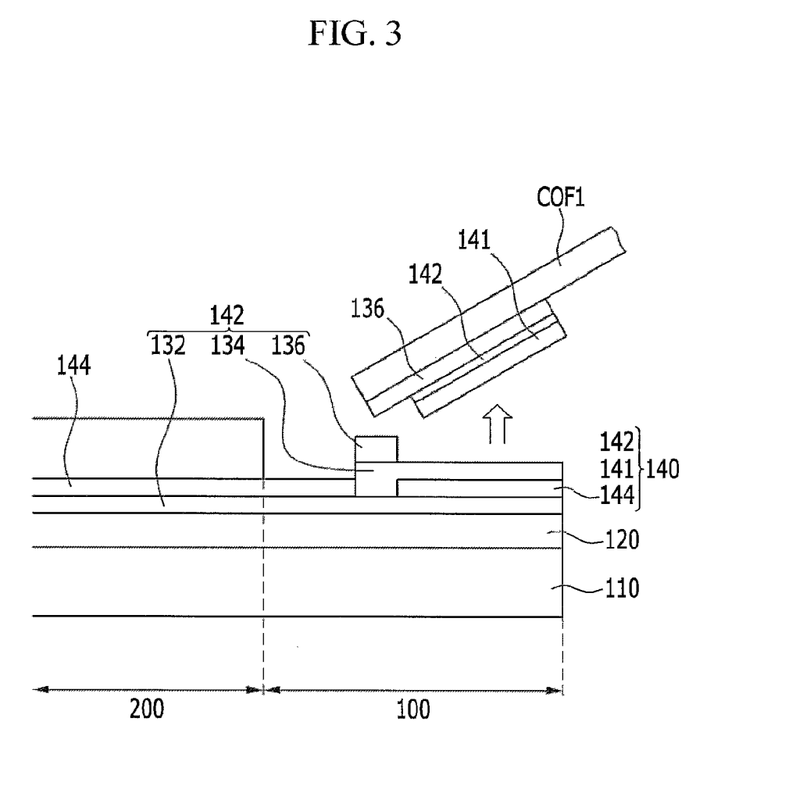
FIG. 3 is a diagram illustrating a figure in which a first flexible printed circuit board is removed from the display device of FIG. 2.

In this case, as illustrated in FIG. 3, a portion of the third electrode layer 136 is left on the second electrode layer 134, but this is merely one example, and the third electrode layer 136 can be completely removed from the second electrode layer 134.

The first organic layer 141 can be formed of an electrically insulating material, and consequently, can have adhesion different from a case in which the second electrode layer 134 and the third electrode layer 136 are directly bonded to each other. In this case, adhesion between the first organic layer 141 and the second electrode layer 134 can be controlled so that the first organic layer 141 can be further easily removed from the second electrode layer 134.

In this case, the first organic layer 141 can further include an adhesive layer 142.

The adhesive layer 142 is formed on one surface of the first organic layer 141, for example, between the first organic layer 141 and the third electrode layer 136, and assists to easily separate the first organic layer 141 and the second electrode layer 134 by enforcing adhesion between the first organic layer 141 and the third electrode layer 136.

Therefore, in the case in which the first organic layer 141 including the adhesive layer 142 is formed, the adhesion between the second electrode layer 134 and the first organic layer 141 can be weaker than the adhesion between the first organic layer 141 and the adhesive layer 142 and can be weaker than the adhesion between the adhesive layer 142 and the third electrode layer 136.

The adhesive layer 142 can be formed of an amorphous silicon material, but is not limited thereto.

Meanwhile, the display device includes the first flexible PCB COF1. The first flexible PCB COF1 can be electrically connected to the third electrode layer 136 and can be formed on the third electrode layer 136.

The first flexible PCB COF1 formed on the third electrode layer 136 can transfer power or a driving control signal supplied from the outside to the display area 200 or transfer an input signal input from the display area 200 to the driving control apparatus.

In the case in which the first organic layer 141 and the second electrode layer 134 are separated as described above, the third electrode layer 136 formed on the first organic layer 141 and the first flexible PCB COF1 can be together removed from the display device.

The display device can further include a second organic layer 144.

The second organic layer 144 can be partially formed between the first electrode layer 132 and the second electrode layer 134 so that one surface thereof is bonded to one surface of the first electrode layer 132 and the other surface thereof is bonded to one surface of the second electrode layer 134.

Figure 5:
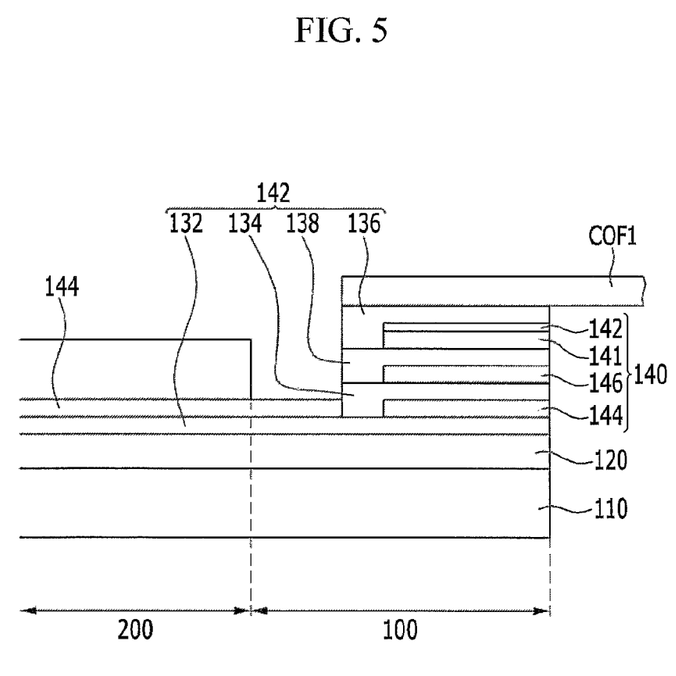
FIG. 5 is a diagram illustrating a display device further including a third organic layer and a fourth electrode layer.

In addition, the display device according to an exemplary embodiment of the described technology can further include a third organic layer 146 and a fourth electrode layer 138 as illustrated in FIG. 5.

The fourth electrode layer 138 can be formed on the second organic layer 144 and can be electrically connected to the first electrode layer 132 and the second electrode layer 134, respectively, and the third organic layer 146 can be formed on the fourth electrode layer 138. Therefore, the third organic layer 146 can be partially formed between the second electrode layer 134 and the fourth electrode layer 138.

Although not illustrated in the drawings, each of the second organic layer 144 and the third organic layer 146 can further include the adhesive layer 142, similar to the first organic layer 141. The adhesive layer 142 formed in each of the second organic layer 144 and the third organic layer 146 can also enforce adhesion between the organic layer and the electrode layer having the adhesive layer 142 therebetween, so as to easily separate one surface of the organic layer on which the adhesive layer 142 is not formed.

On the contrary, according to a modified example of the described technology, instead of the adhesive layer 142, a layer which can be easily separated later can be formed by a replacement into an adhesive layer having only temporary adhesion.

In the case in which the pad area 100 having a multilayer structure in which a plurality of electrode layers and organic layers are alternately stacked as described above, even though the rework processes are repeated for several times, the organic layer 140, the electrode layer 130, and the flexible PCB connected thereon can be removed a plurality of times while the substrate 110 or other electrodes are not damaged.

According to the present exemplary embodiment, since a damage rate of the product due to the rework process can be reduced, yield of the product can be increased and manufacturing costs can be reduced.

Hereinabove, the display device according to an exemplary embodiment has been described. Hereinafter, a manufacturing method of a display device will be described. In a description related to the manufacturing method of the display device, overlapping description will be omitted or simply stated.

A manufacturing method of a display device including an operation of forming a display area 200 and an operation of forming a pad area 100 is provided.

The operation of forming the display area 200 is an operation of forming the display area 200 displaying an image on one area of a substrate 110, and since a specific process thereof can be different depending on a kind of display device, a detailed description thereof will be omitted.

However, by way of example, the display area 200 includes pixels for implementing the image, and consequently, the operation of forming the display area 200 can include an operation of forming a TFT by forming a gate electrode, a source electrode, and a drain electrode, and an operation of forming a pixel electrode connected to the drain electrode.

The operation of forming the pad area 100 includes an operation of a first electrode layer 132, an operation of forming a second electrode layer 134, an operation of forming a third organic layer 146, an operation of forming a first organic layer 141, an operation of connecting a first flexible PCB COF1 to a third electrode layer 136, an operation of checking whether or not defects occur, an operation of removing the first flexible PCB COF1, and an operation of connecting a second flexible PCB COF2.

The operation of forming the first electrode layer 132 includes the operation of forming the first electrode layer 132 which is electrically connected to the display area 200 on the substrate 110. In this case, the first electrode layer 132 can be electrically connected to the gate electrode of the display area 200 and can be simultaneously or concurrently performed with the operation of forming the gate electrode. Therefore, as described above, the first electrode layer 132 can be formed on the same layer as the gate electrode.

The operation of forming the second electrode layer 134 includes the operation of forming the second electrode layer 134 on the first electrode layer 132. In this case, the second electrode layer 134 can be electrically connected to a source/drain electrode of the display area 200 and can be simultaneously or concurrently performed with the operation of forming the source/drain electrode. Therefore, as described above, the second electrode layer 134 can be formed on the same layer as the source/drain electrode.

The operation of forming the third electrode layer 136 includes the operation of forming the third electrode layer 136 which is electrically connected to the second electrode layer 134, and the third electrode layer 136 can be formed on a first organic layer 141 to be described below. In this case, the third electrode layer 136 can be electrically connected to the pixel electrode of the display area 200 and can be simultaneously or concurrently performed with the operation of forming the pixel electrode. Therefore, as described above, the third electrode layer 136 can be formed on the same layer as the pixel electrode.

The operation of forming the first organic layer 141 includes the operation of partially forming the first organic layer 141 having adhesion with the third electrode layer 136 stronger than adhesion with the second electrode layer 134 between the second electrode layer 134 and the third electrode layer 136. Since the second electrode layer 134 and the third electrode layer 136 need to be electrically connected to each other, the first organic layer 141 can be only partially formed between the second electrode layer 134 and the third electrode layer 136.

In this case, as described above, one surface of the first organic layer 141 is bonded to one surface of the second electrode layer 134 and the other surface of the first organic layer 141 is bonded to one surface of the third electrode layer 136. In this case, the adhesion between the one surface of the first organic layer 141 and the one surface of the second electrode layer 134 is weaker than the adhesion between the other surface of the first organic layer 141 and the one surface of the third electrode layer 136. For example, in the case in which separation occurs between the organic layers and the electrode layers due to external force applied thereto, it means that the first organic layer 141 and the second electrode layer 134 can be more easily separated as compared to the first electrode layer 132 and the third electrode layer 136. A detailed description thereof will be provided below.

The operation of connecting the first flexible PCB COF1 to the third electrode layer 136 includes the operation of electrically connecting the first flexible PCB COF1 that transfers power or a driving control signal supplied from the outside to the display area 200 or transfers an input signal input from the display area 200 to the driving control apparatus to the third electrode layer 136.

After the first flexible PCB COF1 is connected to the third electrode layer 136, the operation of checking whether or not the defects occur in the display device can be performed.

The operation of checking whether or not the defects occur includes the operation of checking whether or not the defects occur by checking whether or not an electrical signal of the display area 200 or the pad area 100 of the display device is smoothly transmitted and received. In the case in which it is determined that the defects occur, the operation of removing the first flexible PCB COF1 can be performed.

The operation of removing the first flexible PCB COF1 includes the operation of removing the first flexible PCB COF1 from the substrate 110 in order to perform the rework process for the display device in which the defects occur. In this case, in the display device, the first flexible PCB COF1 can be removed while the first organic layer 141 and the second electrode layer 134 are separated.

As described above, since adhesion between the first organic layer 141 and the second electrode layer 134 is weaker than adhesion between the first organic layer 141 and the third electrode layer 136, if the external force is applied to remove the first flexible PCB COF1, the first organic layer 141 and the second electrode layer 134 having weaker adhesion are separated. Therefore, since the external force is concentrated on a portion having weak adhesion so as to allow the separation to be easily performed, damage of the substrate 110 and the electrode can be prevented while performing a process of separating the first flexible PCB COF1.

As illustrated in FIG. 3, a portion of the third electrode layer 136 is left on the second electrode layer 134, but this is merely one example, and the third electrode layer 136 can be completely removed from the second electrode layer 134, as described above.

In this case, the operation of forming the first organic layer 141 can include an operation of forming an adhesive layer 142 and an operation of bonding the other surface of the first organic layer 141 to the second electrode layer 134.

The operation of forming the adhesive layer 142 includes the operation of forming the adhesive layer 142 on one surface of the first organic layer 141. The adhesive layer 142 is formed on one surface of the first organic layer 141, for example, between the first organic layer 141 and the third electrode layer 136, and can assist to easily separate the first organic layer 141 and the second electrode layer 134 by enforcing adhesion between the first organic layer 141 and the third electrode layer 136. In addition, as described above, the adhesive layer 142 can be formed of a material such as amorphous silicon.

Meanwhile, as a modified example of the present exemplary embodiment, there can be an exemplary embodiment in which the adhesive layer 142 is formed so as to have the weakest adhesion and the adhesion layer 142 is used as a separation layer.

Meanwhile, in the case in which the adhesive layer 142 is formed on the first organic layer 141 as in the present exemplary embodiment, an operation of bonding the second electrode layer 134 to the other surface of the first organic layer 141 on which the adhesive layer 142 is not formed can be performed.

As described above, one surface of the adhesive layer 142 can be bonded to the first organic layer 141 and the other surface of the adhesive layer 142 can be bonded to the third electrode layer 136. Therefore, since the first organic layer 141 and the second electrode layer 134 are separated in the operation of removing the first flexible PCB COF1 and the adhesive layer 142 is formed between the first organic layer 141 and the third electrode layer 136, the adhesive layer 142 can be removed together with the first organic layer 141, the third electrode layer 136, and the first flexible PCB COF1.

Figure 4:
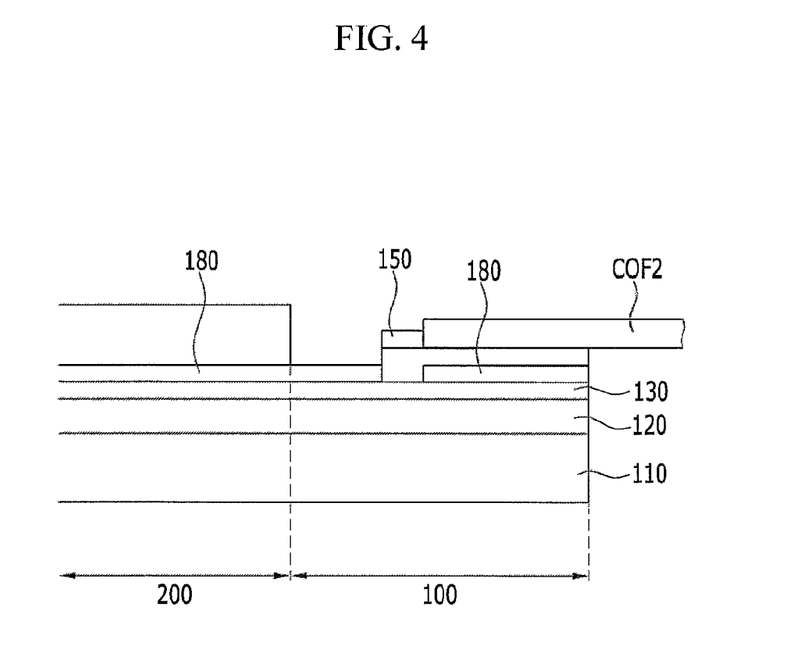
FIG. 4 is a diagram illustrating a figure in which a second flexible printed circuit board is connected to the display device from which the first flexible printed circuit board is removed.

After the first flexible PCB COF1 is removed together with the third electrode layer 136 and the first organic layer 141, the second electrode layer 134 can be exposed to the outside. A second flexible PCB COF2 can be connected to the exposed second electrode layer 134.

The operation of connecting the second flexible PCB COF2 on the second electrode layer 134 includes the operation of electrically connecting the second flexible PCB COF2 on the second electrode layer 134 exposed to the outside due to the removal of the first flexible PCB COF1, as described above.

A series of processes including the operation of removing the first flexible PCB COF1 and the operation of connecting the second flexible PCB COF2 can be defined as a "rework process". It can be different depending on some cases, but the "rework process" can include the operation of checking whether or not the defects occur in the display device.

Meanwhile, the manufacturing method of the display device according to an exemplary embodiment of the described technology can further include an operation of forming a second organic layer 144.

The operation of forming the second organic layer 144 is an operation of forming a stack structure in which the electrode layer 130 and the organic layer 140 formed on the pad area 100 are alternately formed by partially forming the second organic layer 144 between the first electrode layer 132 and the second electrode layer 134.

In this case, the manufacturing method of the display device can further include an operation of forming a fourth electrode layer 138 and an operation of forming a third organic layer 146.

The operation of forming the fourth electrode layer 138 is the operation of forming the fourth electrode layer 138 which is electrically connected to the first electrode layer 132 and the second electrode layer 134 on the second organic layer 144, and the operation of forming the third organic layer 146 is the operation of forming an additional third organic layer 146 on the fourth electrode layer 138. According to the present exemplary embodiment, the second electrode layer 134 can be formed on the third organic layer 146.

Hereinabove, the display device and the manufacturing method of the same according to the described technology have been described. According to the described technology, if the organic layer 140 is further formed between the electrode layers 130, even in the case in which a plurality of rework processes are performed, the flexible PCB can be easily removed while the substrate 110 and the electrode are not damaged due to the organic layer 140 which can be easily separated from the electrode layer 130. Therefore, since a damage rate of the product due to the rework process can be reduced, yield of the product can be increased and manufacturing costs can be reduced.

Although the inventive technology has been described and illustrated, the present invention is not limited thereto and those skilled in the art will appreciate that various modifications, additions and substitutions are possible without departing from the scope and spirit of the invention. Accordingly, such modifications, additions and substitutions are not to be separately interpreted from the spirit and scope of the present invention, and should also be understood to fall within the scope of the present invention as disclosed in the following claims.

What is claimed is:

1. A display device comprising:
    a flexible substrate;
    a display area formed over one area of the substrate and configured to display an image; and
    a pad area formed over another area of the substrate configured to provide an electrical signal to the display area,
    wherein the pad area includes:
        a first electrode layer formed over the substrate and electrically connected to the display area;
        a second electrode layer formed over the first electrode layer and electrically connected to the first electrode layer;
        a first organic layer bonded to a portion of the second electrode layer;
        a third electrode layer bonded to the first organic layer and electrically connected to the second electrode layer; and
        a flexible printed circuit board (PCB) electrically connected to the third electrode layer.

2. The display device of claim 1, further comprising an adhesive layer bonded to the first organic layer and bonded to the third electrode layer.

3. The display device of claim 2, wherein the adhesive layer is an amorphous silicon layer.

4. The display device of claim 1, further comprising a second organic layer formed between the first and second electrode layers.

5. The display device of claim 4, further comprising:
    a fourth electrode layer formed over the second organic layer and electrically connected to the first and second electrode layers; and
    a third organic layer formed over the fourth electrode layer,
    wherein the second electrode layer is formed over the third organic layer.

6. The display device of claim 5, wherein the second to fourth electrode layers have the same width.

7. The display device of claim 1, wherein the first organic layer is formed of an electrical insulating material.

8. The display device of claim 1, wherein the first organic layer is bonded to the second electrode layer at a first adhesion strength, the third electrode layer is bonded to the first organic layer at a second adhesion strength, the adhesive layer is bonded to the third electrode layer at a fourth adhesion strength, and
wherein the first adhesion strength is less than the second adhesion strength and the first adhesion strength is less than the third adhesion strength and the fourth adhesion strength. the substrate is flexible.

9. The display device of claim 1, further comprising a buffer layer formed over the substrate so as to protect the substrate.

10. The display device of claim 1, wherein the display area includes a pixel configured to display the image,
wherein the pixel includes i) a thin film transistor including a gate electrode, a source electrode, and a drain electrode, and ii) a pixel electrode electrically connected to the drain electrode,
wherein the first electrode layer is formed on the same layer as the gate electrode,
wherein the second electrode layer is formed on the same layer as the source and drain electrodes, and
wherein the third electrode layer is formed on the same layer as the pixel electrode.

11. The display device of claim 1, wherein the second and third electrodes have the same width.

12. A method of manufacturing a display device, the method comprising:
forming a display area over one area of a flexible substrate and configured to display an image; and
forming a pad area over another area of the substrate and configured to provide an electrical signal to the display area, wherein the forming of the pad area includes:
forming a first electrode layer electrically connected to the display area;
forming a second electrode layer over the first electrode layer and electrically connected to the first electrode layer;
forming a third electrode layer electrically connected to the second electrode layer;
adhering a first organic layer to the second electrode layer at a first adhesion strength and the third electrode layer at a second adhesion strength, wherein the first adhesion strength is greater than the second adhesion strength;
electrically connecting a first flexible printed circuit board (PCB) to the third electrode layer;
testing for defects in the display device;
separating the first organic layer from the second electrode layer so as to remove the first flexible PCB when there are defects in the display device; and
connecting a second flexible PCB to the second electrode layer.

13. The method of claim 12, wherein the forming of the first organic layer includes:
forming an adhesive layer on a first surface of the first organic layer; and
bonding a second surface of the first organic layer to the second electrode layer.

14. The method of claim 13, further comprising forming a second organic layer between the first and second electrode layers.

15. The method of claim 14, further comprising:
forming a fourth electrode layer over the second organic layer and electrically connected to the first and second electrode layers; and
forming a third organic layer over the fourth electrode layer,
wherein the second electrode layer is formed over the third organic layer.

16. A display device comprising:
a flexible substrate;
a display area formed over one area of the substrate and configured to display an image; and
a pad area formed over another area of the substrate and configured to provide an electrical signal to the display area,
wherein the pad area includes:
a first electrode layer formed over the substrate;
a second electrode layer formed over and directly contacting the first electrode layer;
a first organic layer bonded to a portion of the second electrode layer;
a second organic layer formed between the portion of the second electrode layer and a portion of the first electrode layer;
a third electrode layer bonded to the first organic layer, wherein the third electrode layer directly contacts the second electrode layer; and
a flexible printed circuit board (PCB) formed over the first to third electrode layers.

17. The display device of claim 16, further comprising an adhesive layer bonded to the first organic layer and bonded to the third electrode layer.

18. The display device of claim 16, further comprising:
a fourth electrode layer formed over the second organic layer and electrically connected to the first and second electrode layers; and
a third organic layer formed over the fourth electrode layer,
wherein the second electrode layer is formed over the third organic layer.

19. The display device of claim 16, wherein the substrate is flexible.

20. The display device of claim 16, wherein the display area includes a pixel configured to display the image,
wherein the pixel includes i) a thin film transistor including a gate electrode, a source electrode, and a drain electrode, and ii) a pixel electrode electrically connected to the drain electrode,
wherein the first electrode layer is formed on the same layer as the gate electrode,
wherein the second electrode layer is formed on the same layer as the source and drain electrodes, and
wherein the third electrode layer is formed on the same layer as the pixel electrode.

* * * * *